US005378873A

United States Patent [19]

Katzmann

[11] Patent Number: 5,378,873

[45] Date of Patent: Jan. 3, 1995

[54] ELECTROTHERMAL CONVERSION ELEMENTS, APPARATUS AND METHODS FOR USE IN COMPARING, CALIBRATING AND MEASURING ELECTRICAL SIGNALS

[76] Inventor: Fred L. Katzmann, 48 Bennett Ave., Cedar Grove, N.J. 07009-2004

[21] Appl. No.: 894,103

[22] Filed: Jun. 5, 1992

[51] Int. Cl.[6] .......... H05B 1/02

[52] U.S. Cl. .......... 219/502; 219/505; 219/497; 219/483; 374/183; 250/338.1

[58] Field of Search .......... 219/505, 504, 494, 497, 219/501, 502, 483; 340/606, 588, 589, 587; 324/108; 374/10, 11, 183; 250/337, 384, 338.1

[56] References Cited

U.S. PATENT DOCUMENTS 1,121,835 12/1914 Hiatt .
1,662,889 3/1928 Hubbard .
1,765,563 6/1930 Borden et al. .
1,862,014 6/1932 Grondahl .
2,031,480 2/1936 Hamada .
2,178,548 11/1939 Black et al. .
2,413,021 12/1946 Wolfson et al. .
2,463,805 3/1949 Polye et al. .
2,496,541 2/1950 Johnson, Jr. .
2,545,390 3/1951 Spahn .
2,577,111 12/1951 Downing, Jr. et al. .
3,052,846 9/1962 Hill .
3,267,376 8/1966 Harries .
3,435,319 3/1969 Richman .
3,488,573 1/1970 Cavigelli .
3,521,164 7/1970 Richman .
3,597,685 8/1971 Ford .
3,609,541 9/1971 Scott, Jr. .
3,689,824 9/1972 Malcolm .
3,705,365 12/1972 Szabo .
3,723,845 3/1973 Duckworth .
4,091,284 5/1978 Yamamoto et al. .......... 250/337
4,370,546 1/1983 Warner .
4,659,910 4/1987 Harrison, Jr. et al. .
4,695,793 9/1987 Katzmann .
4,901,006 2/1990 Harrison, Jr. et al. .
5,012,813 5/1991 Pompei et al. .......... 219/494
5,170,041 12/1992 Amith et al .......... 219/497
5,258,602 11/1993 Naselli et al. .......... 219/497

OTHER PUBLICATIONS

Terman, Radio-Engineers' Handbook, First Edition, MacGraw-Hill Book Co., New York and London, pp. 926-929 (1943).

Hemach, "Thermal Converters as AC-DC Transfer Standards for Current and Voltage Measurement at Audio Frequencies," Journal of Research at the National Bureau of Research at the National Bureau of Standards, vol. 48, No. 2, Research Paper-2296, pp. 121-138 (Feb., 1952).

Sears, et al., University Physics, 2nd Edition, Addison-Wesley Publishing Co., Cambridge, Mass. pp. 546-553 (1955).

Richmann, "A New Wideband True RMS-to-DC Converter," IEEE Transactions on Instrumentation and Measurement, p. 129 (Jun., 1967).

Klonz et al., "Accurate Thinfilm Multijunction Thermal Converter on a Silicon Chip," IEEE Transactions on Instrumentation and Measurement, vol. 38, No. 2, pp. 335-337 (Apr., 1989).

Katzmann, "A New Isothermal Multijunction Differential Thermal Element IEEE Transactions on Instrumentation and Measurement", vol. 38, No. 2, pp. 346-350 (Apr. 1989).

*Primary Examiner*—Mark H. Paschall

*Attorney, Agent, or Firm*—Davis Hoxie Faithfull & Hapgood

[57] ABSTRACT

Electrothermal conversion elements, apparatus and methods for use in comparing, calibrating and measuring electrical signals. The element emits IR radiation in response to electrical input. The radiation is collected and converted to an electrical signal proportional to the RMS value of the input signal. Isothermal operation enhances both IR and electrical operation.

17 Claims, 4 Drawing Sheets

310
352
354
360
350
221
0.1
342
LT1040
+4V
-1V
200
-1V
376
340
LT1050
23K
0.1
200
370
372
330
-1V
320
374
120
212
131
132
110
15
20uf
+12V
-12V
100
380

ELECTROTHERMAL CONVERSION ELEMENTS, APPARATUS AND METHODS FOR USE IN COMPARING, CALIBRATING AND MEASURING ELECTRICAL SIGNALS

FIELD OF THE INVENTION

My invention relates to electrothermal conversion method and apparatus for comparing, calibrating and measuring AC signals by electrothermal conversion, in particular, to more rapid methods and apparatus for accomplishing such conversions. My invention further relates to AC comparison, calibration and measurement methods and apparatus utilizing such electrothermal conversion methods and apparatus.

BACKGROUND OF THE INVENTION

Measurement and calibration of AC signals is much more difficult than in the case of DC. One technique is to apply the AC signal to a heater element adjacent to or contacting a temperature sensor such as one junction of a bimetallic junction thermocouple. According to the Seebeck effect, heating such a junction will induce a current in the wires. (In practice, a very high impedance device, such as a voltmeter, typically is interposed in the circuit of the two wires so that current flow is negligible). The joule heating in the heater, caused by the AC input signal, induces a voltage in the thermocouple. This thermocouple voltage is proportional to the temperature difference between the bimetallic junction adjacent to the heater element and a second, cold or reference temperature junction.

In one type of known method for measurement of AC voltages, the unknown AC signal and an easily measurable DC signal are separately applied to a heater associated with a electrothermal sensor, such as a thermocouple. First, when the AC signal is connected to the heater, the thermocouple voltage is nulled to a stable voltage source by adjustment of a potentiometer, which is adjusted to apply an equal and opposite voltage to that generated by the thermocouple. Then, without changing the potentiometer setting, an easily measured DC voltage is substituted for the AC signal applied to the heater element, which again induces a voltage in the thermocouple. The DC voltage amplitude to the heater is increased, increasing the heater temperature, until the voltage generated by the thermocouple is again equal and opposite to the voltage previously set by the potentiometer during the AC measuring cycle. When this null condition is reached, the amplitude of the DC voltage is measured. This DC amplitude is thereby equal to the RMS amplitude value of the AC signal.

Various methods and apparatus for AC signal measurement or calibration to a thermocouple are disclosed, for example, in U.S. Pat. Nos. 3,723,845, 4,659,910 and 4,695,793.

In another method and apparatus, disclosed in U.S. Pat. No. 4,901,006, the same thermal sensing means are used to determine the temperature produced in a heater as a result of two signals. The thermal sensing means and heater are maintained in a fairly narrow temperature range during the measurement process. In embodiments described there, this is accomplished by use of two heaters in thermal contact each connected to a separate signal and by having the thermal sensor sense the net temperature produced by both heaters, producing a difference signal.

SUMMARY OF THE INVENTION

The present invention is an improvement over the prior art described above, using non-contact, optical radiation temperature sensing.

Optical radiation sensing avoids direct contacting bi-metallic thermocouple(s) which drain thermal energy from the heater, reduces temperature variations along the heater which cause Thompson effect errors and avoids shunt paths for higher frequency signal components. The optically sensed thermal element provides improved accuracy over a wider input signal frequency range, faster response time and increased dynamic range when compared to conventional single junction, multi-junction wire or planar thermal elements which use direct contact temperature sensing.

Conventional thermal elements cover an input current dynamic range of two to one. These elements must operate in the square law range so that the peak heater temperature varies by four to one over the input signal range. This temperature excursion may typically be 80 degrees to 320 degrees Celsius. In accordance with this invention, an infra-red emissive target and a non-contacting, optical infra-red pyrometer are employed.

The task of the pyrometer is simplified by use of isothermal operation in accordance with the preferred embodiments, since only the narrow spectrum of a constant temperature (isothermal) is converted to control the negative feedback. In addition, the bias on the feedback heater may be adjusted for a total heater system temperature at the optimum spectral response of the pyrometer and associated IR transmissive components. This assures the greatest dynamic range and best signal to noise performance.

The dynamic operating range is determined by the feedback heater current magnitude between the following limits:

a) no input is applied to the signal heater, and b) the current in the feedback heater approaches zero.

Throughout this range, the heater system temperature is sensed optically by the pyrometer. The output voltage of the pyrometer circuit decreases with increasing heater temperature and controls the feedback heater current. This loop has sufficient response to maintain the dual heater system at a constant temperature.

The two heaters are of nominally equal resistance. The variation in DC feedback current driving the feedback heater element is therefore directly proportional to the RMS value of the input current through the signal heater.

The focused field of view of the optical pyrometer is 2.54 mm in diameter at 7.5 cm from the lens which is focused on a thermopile detector. The heater wires occupy only a fraction of the field of view. An IR radiating target is therefore fastened at the hottest central point of the heater structure. The target must have superior thermal conductivity, have minimal thermal time constant, high electrical resistance, low dielectric constant over the input frequency range and high radiated emissivity. A thin disk of Berlox K-150 (BeO) was selected since it had high emissivity of 0.87 compared to 1.0 for an ideal black body. The disk extends over the heater structure to absorb and integrate its maximum temperature over a substantial portion of the heater length. It effectively averages the peak temperatures along the middle of the heater and avoids sensing only a point of heater temperature. This integration virtually eliminates most Thompson and Peltier error in a manner more effective than most multijunction hot wire converters.

This work was performed with the thermal element at ambient air. An evacuated thermal element would be preferred, but IR transmissive windows compatible with the glass thermoelement enclosure had sufficient losses in the 8 to 12 micron range and when combined with costly anti-reflective coatings appeared to be only slightly more effective than working in ambient air.

Optical radiation sensed thermal element advantages include: improved measurement sensitivity, speed and more constant high frequency accuracy since the thermal and electrical shunt paths presented by conventional direct contact temperature sensing bi-metallic thermocouples are eliminated. The isothermal dual heater differential thermal element is uniquely advantageous when using optical sensing since its rapid response time and constant operating temperature reduce the long term stability requirements and spectral range of the radiation sensing pyrometer, as well as simplifying the spectral bandwidth requirements of the IR transmissive components.

The elements, apparatus and method of my invention are suitable for use in voltage calibration equipment, voltage standards, meter circuits and comparators of the type disclosed in U.S. Pat. No. 4,901,006, the disclosures of which are incorporated herein by reference.

DETAILED DESCRIPTION

Figure 1:
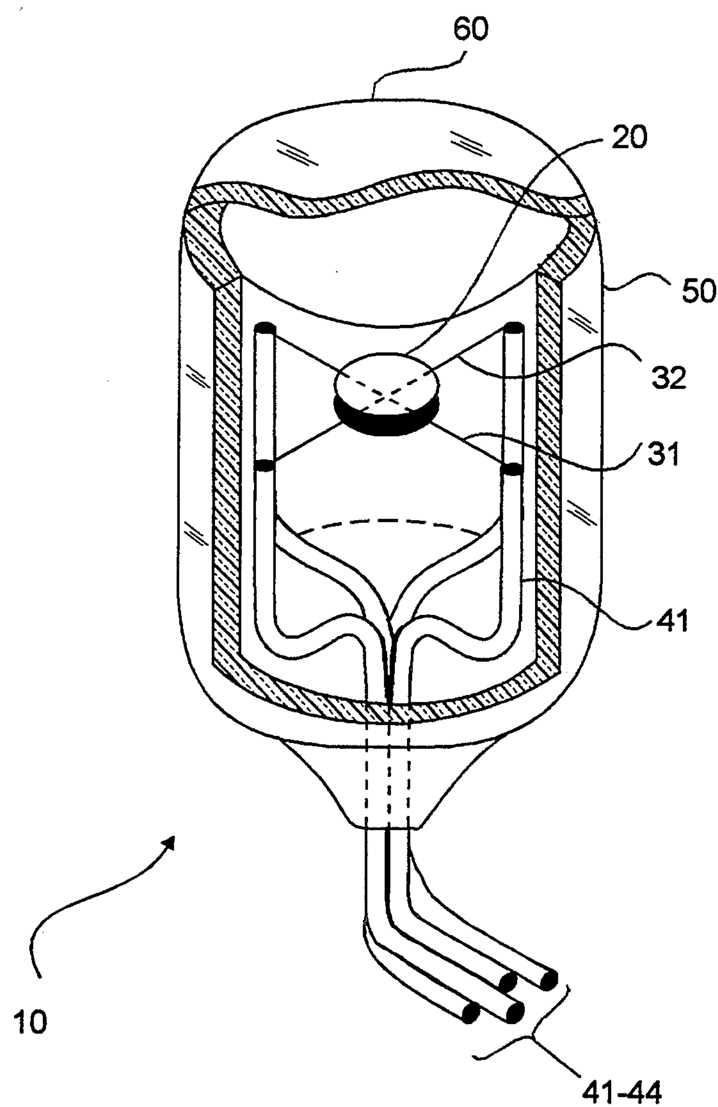
FIG. 1 is a cutaway view of an electrothermal converter device in accordance with an embodiment of my invention.

FIG. 1 is a cutaway view of a electrothermal converter 10 in accordance with my invention. A thin piece of beryllium oxide (BeO) forms the target 20, which in this case is in the form of a disk. The BeO disk was selected since it was commercially available (Berlox K-150, Part No. CF3121, General Ceramics Corp., National Beryllia division, Haskell, N.J., U.S.A.) and fills the field of view of the selected pyrometer. Beryllium oxide exhibits a combination of parameters which make it preferable as a radiating target:

| | |
|---|---|
| Dielectric Constant | 6.65, 1 MHz @ 25° C.<br>6.70, 1 MHz @ 200° C.<br>6.65, 10 MHz @ 25° C.<br>6.65, 10 MHZ @ 200° C.<br>6.70, 1 GHz @ 25° C. |
| Dielectric Strength | 350 Volts per 0.25 mm thickness |
| Electrical Resistivity | $10^{17}$ Ohm/cm @ 25° C. |
| Thermal Conductivity | 0.7 to 0.9 cal/sec °C. cm @ 38° C. |
| Specific Heat | 0.25 cal/°C. gm @ 25° C. |
| Emissivity | 0.87 |
| Maximum Temperature | 1800° C. (In continuous use) |

-continued

| | |
|---|---|
| Density | 2.85 gm/cc |

The BeO target 20 is supported by and is in thermal contact with two heater wires 31, 32, the ends of which are welded to Kovar support wires 41–44. (The two heater version is used for the preferred embodiment circuit, however, a single heater version of the target can be used with alternate application of the AC and DC signals). The foregoing assembly is enclosed in a glass vial 40, with the support wires 41–44 insulated from each other and extending through the vial 50. One end of the vial is either open or closed with an IR transmissive window 60 with anti-reflective coatings on the surfaces. Although use of a sealed, evacuated structure may substantially improve performance with respect to heat loss, that must be balanced against the IR transmission losses through a window 60 which must be provided for an evacuated converter 10.

In an experimental converter in accordance with my invention, the two heater wires were made of 0.154 mm diameter 80–20 Nichrome, stretched across diagonals so as to form an "X". Each heater is approximately 36 Ohms. The two heaters are electrically insulated from one another at their crossing points by a ceramic adhesive. The insulation will withstand 150 Volts DC. The BeO target is attached onto the heater wires using thermally conductive but electrically insulating epoxy. Thinner heater wires of higher resistance would have been preferred, however, were too fragile to reliably support the target used. Therefore, two 36 ohm heaters were used, requiring currents in the 10 to 70 mA range. 80 to 90 ohm heaters would have been preferred to permit more conventional signal currents of 1 to 10 mA.

Figure 2:
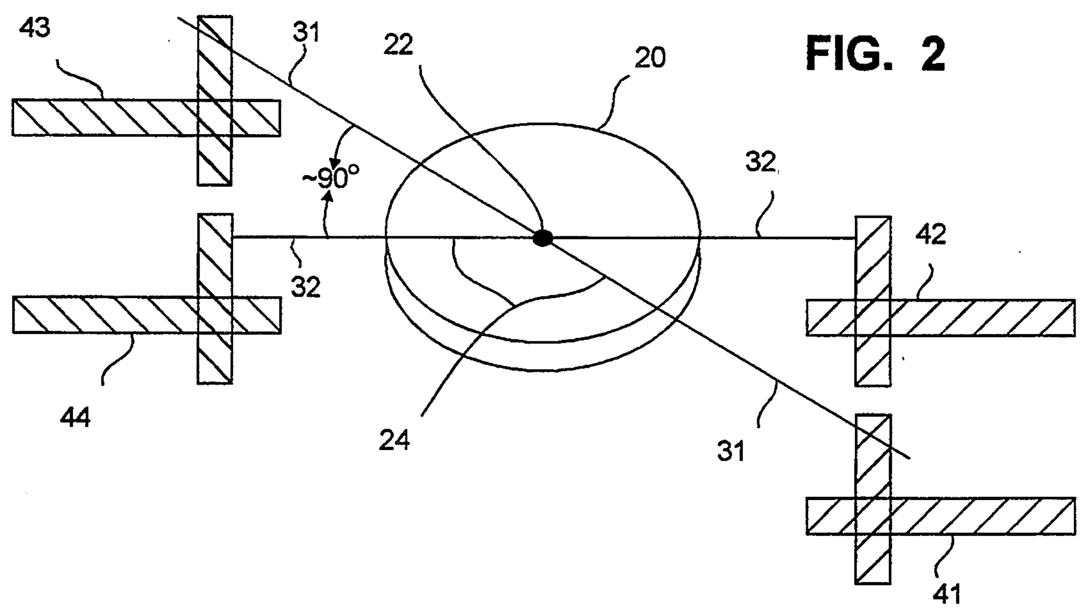
FIG. 2 shows details of the device of FIG. 1.

FIG. 2 is a sketch showing details of the disk 50, heater wires 31, 32 and support wires 41–44. In my preferred embodiment, heater wires 31, 32 are arranged at approximately 90 degrees from each other and are electrically insulated from each other, for example, by insulating adhesive at the point of intersection 32. Thermally conductive adhesive 24 is placed between the wires 31, 32 and the target 20.

Figure 3:
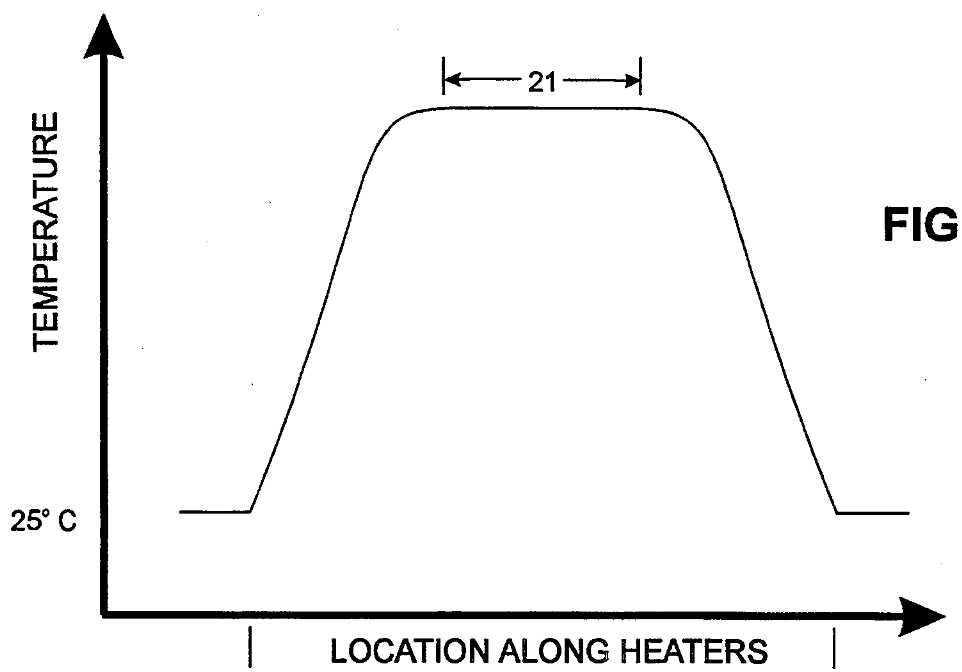
FIG. 3 is a graph of approximate temperatures along the heater wires of the device of FIG. 1.

FIG. 3 shows the approximate temperatures along the heater wires 31, 32. The temperature is relatively constant in the central region 21, which is the region where the target 20 is in contact with the wires, and falls off to near ambient temperature where the heater wires 31, 32 are attached to the support wires 41–44.

Figure 4:
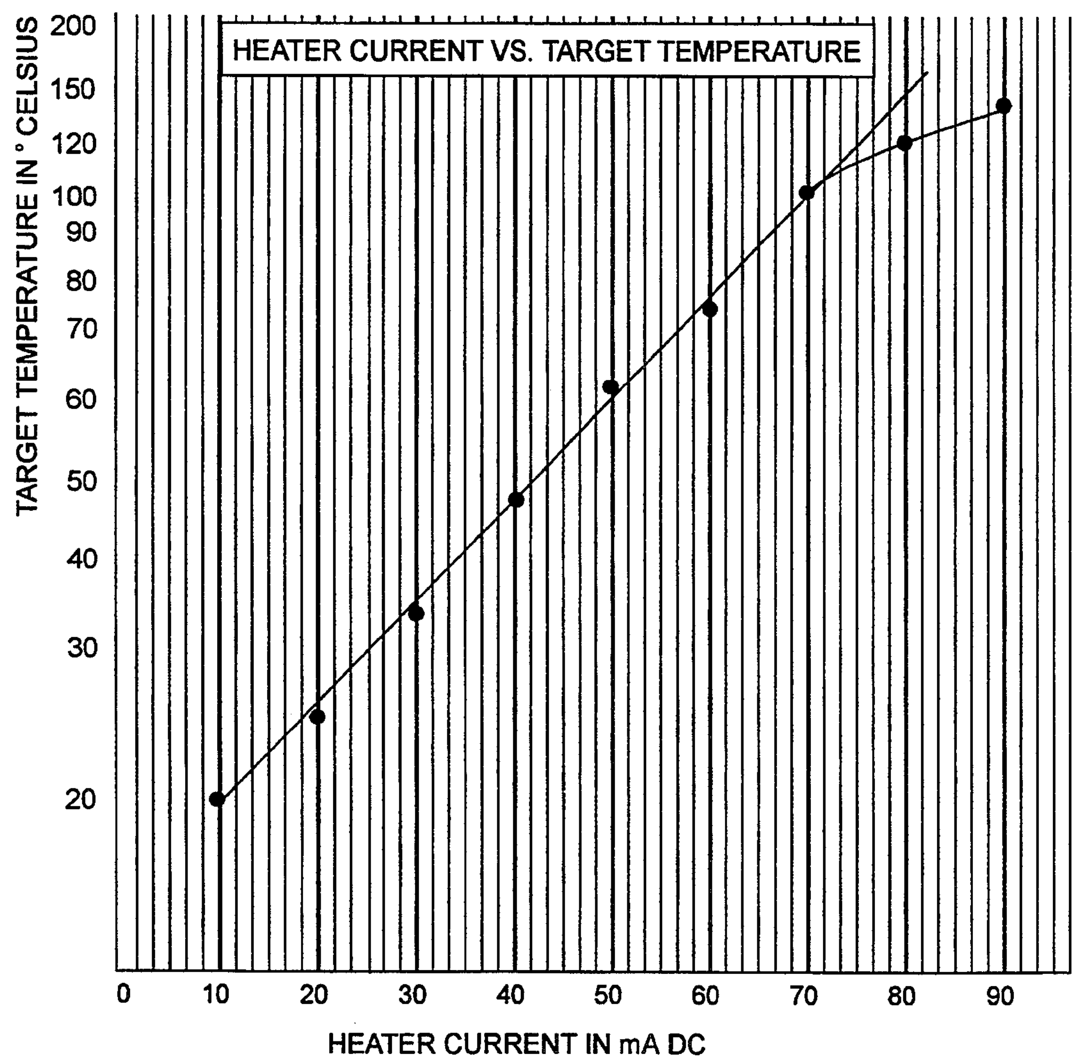
FIG. 4 is a semi-logrithmic graph of temperature versus heater current for one such device.

FIG. 4 illustrates the temperature of the target 20 (a 4.5 mm dia., 0.75 mm thick BeO disk) for various heater currents of a prototype electrothermal converter 10 in which the two heaters 31, 32 were connected in series and had a total resistance of 76.1 ohms. The straight line connecting the data points on this semi-logrithmic graph illustrates the square law performance of the converter 10 over a dynamic range of six to one.

Figure 5:
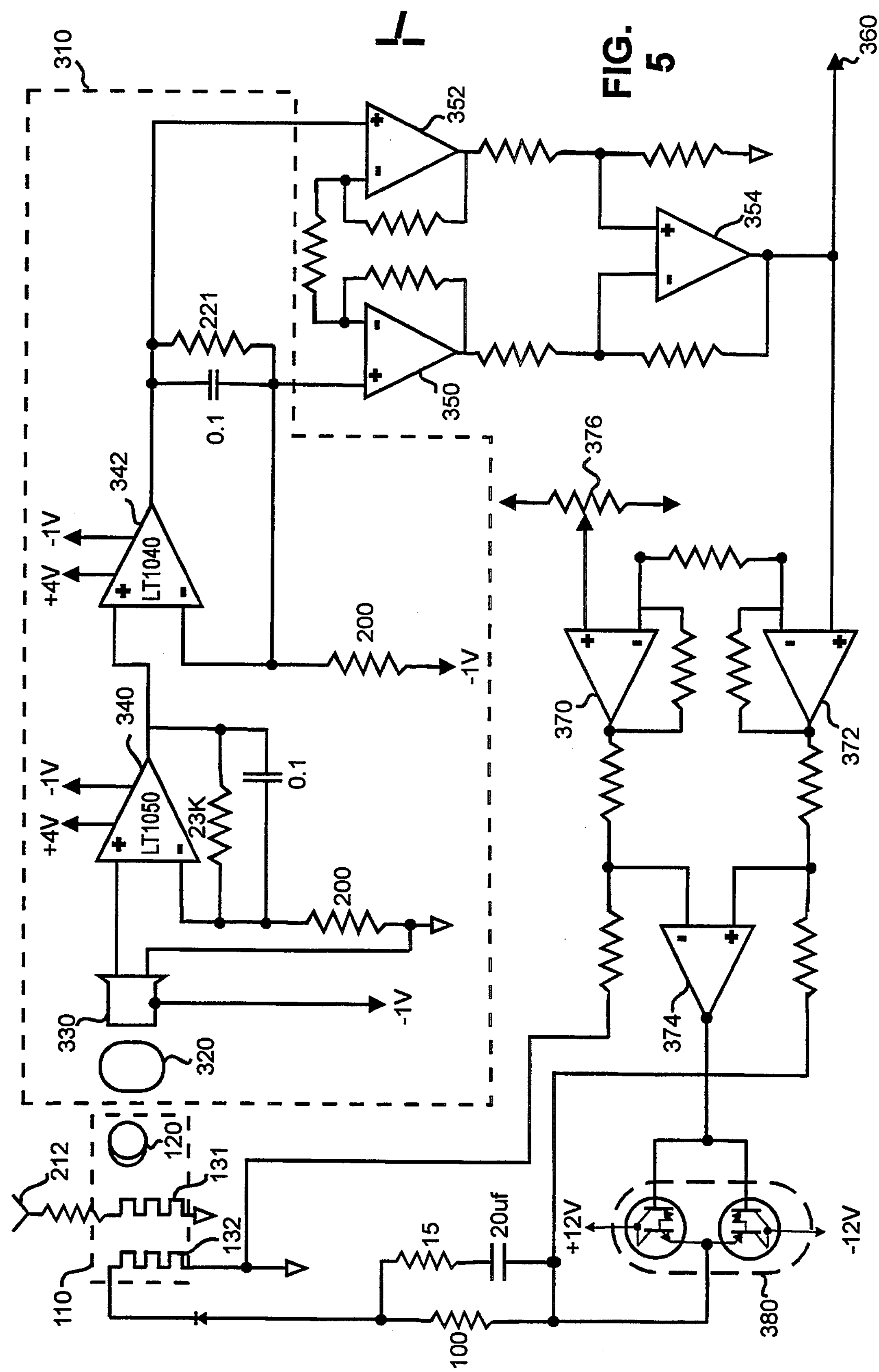
FIG. 5 is a schematic diagram of an AC to DC voltage conversion circuit for operation of the device of FIG. 1.

FIG. 5 is a schematic diagram of a circuit suitable for operation of the electrothermal converter 10 in accordance with my invention. It includes a electrothermal converter 110 similar to the electrothermal converter 10 of FIG. 1, including a target 120 and heater wires 131, 132. The heater 131 is connected through a resistor to the input terminal 212 where the unknown AC signal is applied.

In this embodiment, an Omega Engineering, Inc., series OS1400-L infrared (IR) optical pyrometer 310 has been used to provide the optical interface. The pyrometer has the following characteristics:

| | |
|---|---|
| IR Spectral Response and Temperature Range | 8 to 14 microns −20° C. to 870° C. |
| Field of View (Sighting Head) | 2.5 mm diameter at 7.6 cm from the detector |
| Electrical Output | Continuous Analog |
| Time Constant | 400 mS |

The pyrometer measuring head includes an inline sighting capability to permit proper alignment between the lens 320 and the target 120. The target must fill the field of view of the pyrometer to assure best signal-to-noise ratio. The pyrometer emissivity adjustment (sensitivity) was set slightly lower than the 0.87 rated emissivity of the BeO target. This corrected for the losses in the first surface mirror in the right-angle viewing accessory used with the pyrometer head. The pyrometer head contains the focusing optics, IR transducer, amplifiers, active integrators and ambient temperature correction detectors. The balanced electrical output from the IR sensing channel provides the analog signal supplied to the feedback heater drive and DC output signals. The IR detector is not described by the manufacturer, but is believed to be a photovoltaic thermopile using evaporated bismuth and antimony which provide the best Seebeck coefficient for high output voltage and good stability.

The lens 320 in the pyrometer 310 focuses the IR energy from the target 120 on a thermal sensor 330. The resulting signal is amplified by a chopper stabilized amplifier 340, followed by an operational amplifier 342 connected as an integrator, which are type LT1050 and LT1014 amplifiers, respectively in this embodiment.

The resulting signal from the IR pyrometer 310 is further amplified by instrumentation amplifiers 350, 352, 354, which are sections of a 1NA110 integrated circuit in this embodiment. The output of amplifier 354 is a DC output 360. The value of this output is generally representative of the target temperature, and a varying DC component of this output is representative of the AC RMS input voltage at the input terminal 212.

Additional instrumentation amplifiers 370, 372, 374 (sections of another 1NA110 integrated circuit in this embodiment) provide additional amplification and polarity reversal for negative feedback to the reference heater 132 in the isothermal operating circuit which is preferred in accordance with my invention. Potentiometer 376 is used for bias adjustment, to set the operating temperature. A type OPA633 double Darlington transistor, low impedance, power amplifier 380 with a gain of approximately one, isolates the 1NA110 integrated circuit from the reference heater and supplies the reference heater current 132 which maintains the target 120 at the nearly constant temperature.

In conventional single heater thermal-elements (SJTE), the heater may rise in temperature by 150° C. when the signal current rises from zero to the usual full scale of 5 mA. Such units will take 10 or more seconds to reach thermal stability and final DC output. In multi-junction thermal elements (MJTE), a substantial amount of signal energy is thermally drained off by the many junctions which shunt the heater. This decreases the output voltage per junction in the MJTE when compared to the SJTE. The increased mass of the MJTE may result in settling times as long as 40 seconds.

The new converter 110 operates in a manner where the net temperature of the heater structure, as sensed by the radiating target, remains nearly constant (isothermal operation). As the signal heater increases in temperature with increased input signal, the BeO target gets slightly warmer as the result of current in heater 131. This is sensed by the pyrometer which immediately reduces feedback current to heater 132. This negative feedback control loop maintains the net energy of both heaters constant as integrated by the BeO target. The target 120 has relatively low mass and the entire structure, driven by negative feedback, with gain exceeding 50,000, remains at a constant temperature within a few millidegrees Celsius. The apparatus of FIG. 5 was observed to settle within less than 12 seconds to a stable final value of DC output. It is important to note that the entire measurement of AC to DC conversion occurs in one simultaneous measurement cycle in accordance with this embodiment of my invention. Conventional thermal converters require both individual AC and DC cycles, therefore, requiring two discrete settling time periods. Only one settling time period is required for the present apparatus and method.

The transfer characteristic of this embodiment indicates excellent square law conversion over a dynamic operation range of greater than six to one, as shown in FIG. 4. This is appreciably better than the two to one dynamic range of conventional thermal-elements. In addition, the observed DC reversal difference was less than 5 ppm. This may be due to reduced Thompson effects in an isothermal heater structure and because the BeO target fully integrates the temperature over approximately half the heater length rather than having individual thermocouples sense temperature at one or more discrete points along the heater.

Figure 6:
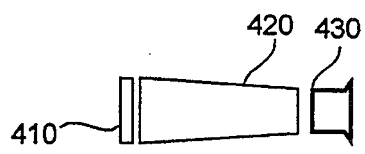
FIG. 6 is a schematic diagram of an embodiment using an IR optical waveguide.

FIG. 6 shows an electrothermal converter element comprising a target 410 and a thermal sensor 330, like target 10 and thermal sensor 330 described above, which are coupled by an optical waveguide 420 of IR transmissive material. The waveguide may be a single fiber or a bundle of fibers, preferably coated with an outer layer (except at the ends) to improve internal reflection in the known fashion.

Figure 7:
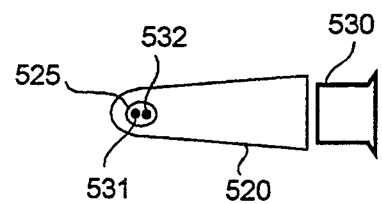
FIG. 7 is a schematic diagram of another embodiment using an IR optical waveguide and heater wires without a separate target.

FIG. 7 shows an electrothermal converter element comprising a pair of heater wires 531, 532, electrically insulated with a high IR emissive material such as BeO, which pass through a hole 525 in an optical waveguide 520 of IR transmissive material. The heater wires can be twisted together or paralleled, forming the target themselves, without the need for a separate target. The optical waveguide 520 is suitably formed to maximize collection of radiation from the heater wires (for example, by use of a cylindrical parabolic lens with the hole 525 at the focal point, transitioning to a circular cross-section) to transmit radiation to the thermal sensor 530. The waveguide 520 is preferably coated with an outer layer (except within the hole 525 and at the end adjacent the thermal sensor 530).

I claim:

1. An electrothermal conversion element for use in a system including a radiation pyrometer, for use in conversion of a first electrical signal of unknown RMS amplitude to another electrical signal having an amplitude representative of the RMS amplitude of the first signal, said conversion element comprising a thin, low mass, high emissivity target and a first heater which is thermally connected to heat said target and can be electrically connected to receive said first signal.

2. The element of claim 1 further comprising a second heater which is also thermally connected to heat said target and can be electrically connected to receive a second electrical signal.

3. The element of claim 2 wherein the first and second heaters are of substantially the same construction and have similar thermal connections to said target.

4. The element of any of claims 1–3 wherein the target is beryllium oxide.

5. An electrical signal conversion apparatus for receiving a first electrical signal of unknown RMS amplitude and for producing another electrical signal having an amplitude representative of the RMS amplitude of the unknown amplitude signal, said apparatus comprising a thin, low mass high emissivity target, a first heater which is thermally connected to heat said target and is powered by the first electrical signal, and a radiation pyrometer arranged to receive radiant energy from said target and producing the representative signal.

6. The apparatus of claim 5 further comprising a second heater which is also thermally connected to said target.

7. The apparatus of claim 6 wherein the first and second heaters are of substantially the same construction and have similar thermal connections to said target.

8. The apparatus of any of claims 5–7 wherein an infrared transmissive lens collects radiation from said target and focusses it on said pyrometer.

9. The apparatus of claim 8 wherein the target is beryllium oxide.

10. The apparatus of any of claims 5–7 wherein one or more optical waveguides collect radiation from said target and convey it to said pyrometer.

11. The apparatus of claim 10 wherein the target is beryllium oxide.

12. The apparatus of any of claims 5–7 wherein the target is beryllium oxide.

13. An electrical signal conversion apparatus comprising the element of claims 5–7 wherein the first signal of unknown amplitude is connected to the first heater and a second electrical signal from the output of the pyrometer is connected to heat the second heater via a feedback circuit which is arranged to maintain the temperature of the target relatively constant with variations in the unknown amplitude signal.

14. The apparatus of any of claims 5–7 wherein the second electrical signal is inversely proportional to the first electrical signal.

15. The apparatus of claim 13 wherein the second electrical signal is inversely proportional to the first electrical signal.

16. A method for conversion from a first electrical signal to a second electrical signal of inversely proportional RMS amplitude comprising the steps of heating a target with a heater powered by the first electrical signal which is the signal to be converted, concurrently further heating said target to achieve a desired nominal temperature with a heater powered by the second electrical signal, transmitting infrared radiation produced by the heating from the target to a radiation pyrometer, and utilizing the output of the pyrometer to maintain the temperature of the target relatively constant at the desired nominal temperature by controlling adjusting the amplitude of the second signal.

17. A method for measuring the RMS amplitude of a first signal comprising the steps of claim 16 and further comprising the step of measuring the amplitude of a signal derived from the second signal.

* * * * *